United States Patent [19]
Konii et al.

[11] 4,209,429
[45] Jun. 24, 1980

[54] PROCESS FOR PRODUCING INTERNALLY PLASTICIZED PHENOLIC RESINS

[75] Inventors: Susumu Konii, Tokyo; Yukio Yoshimura, Saitama; Ken Nanaumi, Shimodate; Kohei Yasuzawa, Shimodate; Takeshi Yoshida, Shimodate; Toyotaro Shinko, Shimodate, all of Japan

[73] Assignee: Hitachi Chemical Company, Ltd., Japan

[21] Appl. No.: 937,115

[22] Filed: Aug. 28, 1978

[30] Foreign Application Priority Data

Aug. 29, 1977 [JP] Japan .................. 52-104034
Aug. 29, 1977 [JP] Japan .................. 52-104035
Aug. 29, 1977 [JP] Japan .................. 52-104036
Aug. 29, 1977 [JP] Japan .................. 52-104037

[51] Int. Cl.$^2$ .................. C08G 8/10; C08G 8/20; C08G 8/32
[52] U.S. Cl. .................. 260/19 R; 260/19 EP
[58] Field of Search .................. 260/19 EP, 19 R

[56] References Cited

U.S. PATENT DOCUMENTS

| 1,947,415 | 2/1934 | Heck .................. 260/19 R |
| 3,256,222 | 6/1966 | Dalibor et al. .................. 260/19 EP |
| 3,947,393 | 3/1976 | Sato et al. .................. 260/19 R |

FOREIGN PATENT DOCUMENTS 996101 6/1965 United Kingdom .
1328048 8/1973 United Kingdom .

Primary Examiner—Ronald W. Griffin
Attorney, Agent, or Firm—Craig & Antonelli

[57] ABSTRACT

Internally plasticized phenolic resins suitable for use in preparing laminates and the like excellent in electrical properties, heat resistance, solvent resistance as well as punchability are produced by reacting a phenol-formaldehyde resin containing less than 4% by weight of unreacted free monohydric phenol or phenols with an epoxidized vegetable oil, and if required with formaldehyde, with heating preferably in the presence of one or more secondary and/or tertiary amines.

24 Claims, No Drawings

PROCESS FOR PRODUCING INTERNALLY PLASTICIZED PHENOLIC RESINS

This invention relates to a process for producing internally plasticized phenolic resins suitable for use in preparing laminates and the like excellent in electrical properties, heat resistance, solvent resistance and particularly excellent in punchability.

Recently, laminates used for insulating materials, particularly used for communications equipment and electronic equipment, have been required to be excellent in punchability at normal or relatively low temperatures, that is, so-called cold punchability, from the viewpoint of automating and reduction of labor. In order to attain such a purpose, there have been proposed various methods, e.g. using phenol in combination with an alkylated phenol, using such a modifier as drying or semi-drying vegetable oils, etc. in order to increase flexibility of phenolic resins. But these methods have various defects in that, in the case of using the alkylated phenol cold punchability is insufficient, and in the case of using the vegetable oil, due to relatively slow reaction between the double bonds of the vegetable oil and the phenols, the vegetable oil or the double bonds thereof are retained unreacted in the resin as they are, which results in lowering in heat resistance of laminates, gelation caused by polymerization between the double bonds each other, and various problems in workability during the manufacturing. In order to improve such defects, methods for using epoxidized vegetable oils have been proposed (British Pat. No. 996,101, U.S. Pat. No. 3,256,222, German Offenlegungsschrift No. 2,225,458, etc.). But according to these methods, not only in the case of using phenol monomer but also in the case of using a resol or novolac type phenol-formaldehyde resin, the hydroxyl groups of unreacted phenol or phenols present in the resin react with the epoxy groups of the epoxidized vegetable oil preferentially to make the phenol nucleus itself inactive to formaldehyde. Since the thus produced reaction product between the phenol and the epoxidized vegetable oil remains in the resin uncured without reacting with formaldehyde as mentioned above, punchability of laminates may be improved but other properties such as heat resistance, solvent resistance and the like are insufficient.

It is an object of the present invention to provide a process for producing internally plasticized phenolic resins suitable for use in preparing laminates and the like excellent in punchability as well as electrical properties, heat resistance and solvent resistance, by using an expoxidized vegetable oil.

The present invention provides a process for producing an internally plasticized phenolic resin which comprises reacting a phenol-formaldehyde resin containing less than 4% by weight of unreacted free monohydric phenol or phenols with an epoxidized vegetable oil, and if required with formaldehyde, with heating preferably in the presence of one or more secondary and/or tertiary amines.

The order of reacting the phenol-formaldehyde resin, the epoxidized vegetable oil and formaldehyde is not limited and there may be possible a method for reacting the phenol-formaldehyde resin with the epoxidized vegatable oil first and then with formaldehyde, a method for reacting the epoxidized vegetable oil with formaldehyde first and then with the phenol-formaldehyde resin or a method for reacting the phenol-formaldehyde resin, the epoxidized vegetable oil and formaldehyde simultaneously. But it is preferable to react the phenol-formaldehyde resin with the epoxidized vegetable oil first and then with formaldehyde. In this case, it is possible to add a phenol or a bisphenol together with formaldehyde to the reaction system of the phenol-formaldehyde resin and the epoxidized vegetable oil.

Since the phenol-formaldehyde resin does not contain unreacted free monohydric phenols in an amount of 4% by weight or more, it has a plasticizing effect and can prevent molded or finished articles obtained therefrom from lowering of properties such as heat resistance, solvent resistance and the like due to no reaction product between an epoxidized vegetable oil and a phenol, said reaction product being inactive to formaldehyde as disclosed in the above-mentioned patents.

When the phenol-formaldehyde resin containing less than 1% by weight of unreacted free monohydric phenol or phenols is used in the present invention, lowering in the properties such as heat resistance and solvent resistance can almost completely be prevented.

The term "phenol-formaldehyde resin" used in this invention includes a novolac resin such as a novolac type phenol-formaldehyde resin (in this case the term "phenol" means a phenol mononucleus compound, i.e. a phenol having one phenol nucleus) and a novolac type bisphenol-formaldehyde resin, and a resol type phenol-formaldehyde resin. in any case, the phenol-formaldehyde resin should not contain unreacted free monohydric phenols in an amount of 4% by weight or more.

The novolac type phenol-formaldehyde resin can be prepared by reacting a phenol, e.g. phenol itself, m-cresol, o-cresol, p-cresol, t-butylphenol, octylphenol, nonylphenol, or the like with formaldehyde in the presence of a conventional acid catalyst such as hydrochloric acid, phosphoric acid, oxalic acid, p-toluenesulfonic acid, benzenesulfonic acid, or the like according to a conventional method, and removing unreacted phenols, e.g. by removing by distillation under reduced pressure, by water washing, or by evaporating, or the like.

The novolac type phenol-formaldehyde resin can, for example, be represented by the formula:

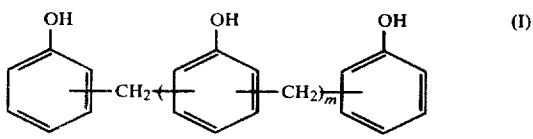

wherein m is an integer of 1 or more or zero.

The term "formaldehyde" in this invention includes not only formalin (an aqueous solution of formaldehyde) and paraformaldehyde buy also hexamethylenetetramine and other compounds which can generate formaldehyde.

The novolac type bisphenol-formaldehyde resin can be prepared by reacting a bisphenol with formaldehyde in the presence of a conventional acid catalyst according to a conventional method.

The term "bisphenol" means in this invention a compound represented by the formula:

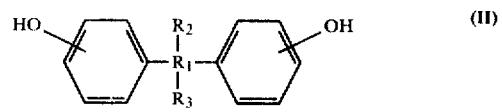

wherein $R_1$ is an alkylene residue having 1 to 3 carbon atoms; and $R_2$ and $R_3$ are independently hydrogen or a saturated or unsaturated hydrocarbon group having 1 to 3 carbon atoms. Examples of the bisphenols are 4,4'-dihydroxydiphenylpropane-2,2 (bisphenol A), 4,4'-dihydroxydiphenylmethane (bisphenol F), 4,4'-dihydroxydiphenylcyclohexane, 4,4'-dihydroxydiphenylpentane-3,3, 4,4'-dihydroxydiphenylbutane-2,2, 2-(4-hydroxyphenyl)-4-methyl-4-(4-hydroxyphenyl)-pentene-1, and the like.

The bisphenols can also be represented by the following formula:

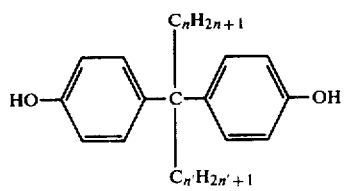

(III)

wherein n and N' are independently zero or an integer of 1 to 4.

The novolac type phenol-formaldehyde resin and the novalac type bisphenol-formaldehyde resin can be used alone or as a mixture thereof or as a copolycondensation product thereof.

Since the novolac resins do not cure by themselves and are thermoplastic resins having flexibility, they can afford flexibility to make plasticization effectively after curing of final products. Since the novolac type phenol-formaldehyde resin is rich in reactivity with the epoxidized vegetable oil and the epoxidized vegetable oil remains unreacted in a small amount, molded or finished articles obtained by using such a resin are preferable in having excellent solvent resistance, heat resistance and dimensional stability. On the other hand, the novolac type bisphenol-formaldehyde resin contains no phenol mononucleus compounds and moreover contains only a relatively small amount of phenol dinuclei compounds. That the phenol mononucleus compound is not present and the amount of the phenol dinuclei compounds is very small and the number of average hydroxyl groups per molecule of the novolac bisphenol-formaldehyde resin is very large makes probability of reacting all the phenolic hydroxyl groups in the molecule of the resin with the epoxy groups very little, which results in making the reactivity with formaldehyde great. Therefore, molded or finished articles obtained by using such a resin are excellent in solvent resistance, heat resistance, insulation resistance, and dimensional stability. If a mixture of the novolac type phenol-formaldehyde resin and the novolac type bisphenol-formaldehyde resin is used, the resulting finished articles are particularly excellent in solvent resistance, heat resistance, and dimensional stability by the sum of the above-mentioned effects.

A mixture or polycondensate of the novolac resin, preferably the novolac type phenol-formaldehyde resin and a bisphenol can be used as a starting material.

The resol type phenol-formaldehyde resin containing unreacted free monohydric phenols in an amount of less than 4% by weight can slso be used as a starting material. Such a resol resin can be prepared, for example, by the following special process: 3.0-6.0 moles, preferably 3.5-6 moles of formaldehyde is reacted with one mole of a phenol such as phenol itself, m-cresol, o-cresol, p-cresol, xylenols, t-butylphenol, octylphenol, nonylphenol, or the like in the presence of an alkaline catalyst in an amount of 0.05-2.0 moles, preferably 0.1-1.0 mole per mole of the phenol with heating, preferably at a temperature of 40° to 100° C., more preferably 50° to 80° C., and the resulting reaction solution is neutralized with an acid to a pH of 7.0 or less, preferably 4.5 to 6.5, to separate the desired resin precipitated. The amounts of the catalyst and formaldehyde used in the above-mentioned process are about 2 or 3 times or more as much as those used in a conventional process, that is, 1.0 to 3.0 moles of formaldehyde and 0.02 to 0.03 mole of a catalyst per mole of phenol.

As the phenols, phenol itself, m-cresol, o-cresol, p-cresol, xylenol, t-butylphenol, octylphenol, nonylphenol, and the like can be used.

As the alkaline catalyst, there can be used oxides or hydroxides of alkali metals such as sodium, potassium, lithium, and the like; tertiary amines such as trimethylamine, triethylamine, tripropylamine, tributylamine, triamylamine, triallylamine, dimethylaniline, diethylaniline, tribenzylamine, triphenylamine, benzyldimethylamine, and the like.

As the acid used for neutralization, inorganic acids such as sulfuric acid, hydrochloric acid, and the like, and organic acids such as acetic acid, para-toluenesulfonic acid, benzenesulfonic acid, and the like can be used.

pH of 7.0 or less is preferable in the neutralization, since with a decrease of the pH a yield of the resin precipitated increases, particularly the yield of precipitated resin is better at pH 4.5-6.5. But if the pH is too low, polymerization proceeds due to condensation of methylol groups. If the pH is 4.5 or more, condensation of methylol groups hardly takes place.

The phenol-formaldehyde resin containing less than 4% by weight of unreacted free monohydric phenol or phenols is reacted with the epoxidized vegetable oil with heating, preferably at a temperature of from 80° to 160° C.

As the epoxidized vegetable oil, internally epoxidized one in which double bonds of the fatty acid in an unsaturated vegetable oil are oxidized and which has an oxirane oxygen content of 2 to 8% can preferably be used. Examples of the epoxidized vegetable oils are epoxidized linseed oil, epoxidized soya bean oil, epoxidized castor oil, epoxidized dehydrated castor oil, and the like.

It is preferable to use one or more secondary and/or tertiary amines as catalyst. Examples of secondary amines are dimethylamine, diethylamine, dipropylamine, dibutylamine, diallylamine, diamylamine, and the like. Examples of tertiary amines are trimethylamine, triethylamine, tripropylamine, tributylamine, triamylamine, triallylamine, dimethylaniline, diethylaniline, tribenzylamine, triphenylamine, benzyldimethylamine, and the like.

It is preferable to react the epoxidized vegetable oil with the phenol-formaldehyde resin in a ratio of 1:0.5 to 1:8, preferably 1:1 to 1:3, in terms of the molar ratio of the epoxy group to the phenolic hydroxyl group. If the value of the phenolic hydroxyl group is less than 1, plasticizing effect increases but such properties as solvent resistance, insulation resistance, heat resistance of finished articles are lowered. If the value is larger than 8, lowering of the properties scarcely takes place but plasticizing effect decreases.

If the novolac type phenol-formaldehyde resin or novolac type bisphenol-formaldehyde resin or a mixture or polycondensation product thereof is used as the phenol-formaldehyde resin, since it cannot be cured as it is, formaldehyde is added to the reaction system preferably after the reaction of the phenol-formaldehyde resin with the epoxidized oil to react therewith. It is preferable to use 0.5 to 4 equivalents of formaldehyde per equivalent of the phenol-formaldehyde resin. The reaction is carried out preferably at a temperature of 50° to 100° C. As catalyst, there can be used conventional hydroxides or oxides of alkali metals or alkaline earth metals, and organic base materials such as ammonia, trimethylamine, ethylenediamine, dimethylamine, methylamine, etc.

It is preferable to stop the reaction at a gel time of 120-270 seconds measured on a hot plate (160° C.) according to a conventional method.

One or more phenols such as phenol, m-cresol, o-cresol, p-cresol, t-butylphenol, octylphenol, nonylphenol, or the like can be added to the reaction system together with formaldehyde.

The following examples will serve further to illustrate the present invention. In the examples, all parts and percents are by weight unless otherwise specified.

EXAMPLES 1 and 2, COMPARATIVE EXAMPLE 1

Resin (A)

In a 3 liter flask equipped with a reflux condenser, a thermometer and a stirrer, 1000 g of phenol, 430 g of 37% formalin, and 1.5 g of oxalic acid as catalyst were placed and the resulting mixture was heated in an oil bath. When the temperature of the mixture became 85° C., heating was stopped and the temperature was raised by the heat of reaction evolved to bring about reflux with boiling. After violent reflux was subsided, the mixture was heated again to continue the reaction for 1 hour. After the reaction, the reaction product in the flask was moved to an evaporating dish and a water layer was removed by decantation. The resin portion in the evaporating dish was heated with stirring to remove water and unreacted phenol. When a resin temperature became 170°-175° C., heating was stopped and the resin was flowed on a metal tray and solidified to give a novolac type phenol-formaldehyde resin. No unreacted phenol retained was identified by high-speed liquid gel permeation chromatography (HLC). Hydroxyl equivalent was 102.

In a 2 liter three-necked flask equipped with a stirrer, a thermometer, and a condenser, 500 g of the thus obtained resin, 500 g of epoxidized linseed oil and 2 g of triethylamine were placed and heated. The reaction was carried out at 160° C. for 5 hours. It was ascertained by HLC that the peaks representing epoxidized linseed oil were almost varnished. To the reaction solution, 221 g of 80% paraformaldehyde and 24 g of 25% ammonia water were added and reacted at 80° C. for 4.5 hours. The resulting resin had a gel time of 203 seconds on a hot plate (160° C.).

The resin was dissolved in 400 g of methyl ethyl ketone to give a varnish. The varnish (950 g) was mixed with 750 g of a varnish of water soluble phenol resin explained hereinafter to give Resin (A).

Resin (B)

In a 2 liter flask equipped with a stirrer, a thermometer, and a condenser, 500 g of the novolac type phenol-formaldehyde resin used for preparing Resin (A), 300 g of epoxidized soya bean oil, 221 g of 80% paraformaldehyde, and 19.2 g of 25% ammonia water were placed and reacted at 80° C. for 6.5 hours. The resulting reaction product had a gel time of 220 seconds measured on a hot plate (160° C.).

The reaction product was completely dissolved in 350 g of acetone to give a yellow transparent varnish, i.e. Resin (B).

Resin (C) (A water soluble phenol resin)

Phenol (400 g), 600 g of a 37% formalin solution, and 40 g of 30% trimethylamine were reacted at 60° C. for 10 hours. After removing water under reduced pressure, methanol was added to the resulting resin to give a water soluble phenol resin varnish having a nonvolatile content of 60%.

Resin (D) (Comparison)

m-Cresol (800 g), 450 g of tung oil, and 1 g of p-toluenesulfonic acid were placed in a 3 liter flask and the reaction was carried out at 120° C. for 2 hours. Subsequently, the reaction solution was cooled to 70° C. and 383 g of 80% paraformaldehyde and 30 g of 25% ammonia water were added thereto. The reaction was carried out at 70° C. for 5 hours while removing water under reduced pressure. The resulting resin had a gel time of 211 seconds on a hot plate (160° C.).

The resin was dissolved in 400 g of methyl ethyl ketone to give a tung oil modified phenol resin resol varnish, i.e. Resin (D).

Cotton linter paper was impregnated with Resin (C), the water soluble phenol resin, and dried to produce resin impregnated paper having a resin content of 15%. The resulting resin impregnated paper was further impregnated with Resin (A), (B) or (D) (for comparison), and dried to produce resin impregnated paper having a resin content of 48%.

Eight sheets of the resin impregnated paper and one sheet of copper foil having a binding agent on one side were piled up and compressed at 160°-170° C. under 140 kg/cm² for 50 minutes to give a copper-clad laminate of 1.6 mm thick.

Physical and chemical properties of thus produced copper-clad laminates are as shown in Table 1.

Table 1

| Varnish | Example 1 Resin (A) | Example 2 Resin (B) | Comparative Example 1 Resin (D) |
|---|---|---|---|
| Insulation JIS-C6481 A resistance (Ω) JIS-C6481 | $9.2 \times 10^{11}$ | $4.7 \times 10^{11}$ | $1.4 \times 10^{11}$ |
| D-2/100 | $1.7 \times 10^{10}$ | $9.3 \times 10^{10}$ | $6.5 \times 10^9$ |
| Heat resistance in the air (at 200° C.) | Over 60 minutes No change | Over 60 minutes No change | 30 minutes No change |
| Heat resistance in solder at 260° C. (sec) | 46.4 | 68.8 | 33.8 |
| Solvent resistance (in trichloroethylene) JIS-C6481 D | Over 60 minutes No change | Over 60 minutes No change | 30 minutes No change |
| Punchability JIS-C6481 A | | | |
| Surface | 80 | 70 | 70 |
| Edge face | 70 | 90 | 70 |
| Hole (points/100) | 80 | 80 | 70 |
| Water absorption (%) JIS-C6481 D-24/23 | 0.72 | 0.77 | 0.82 |

EXAMPLE 3

Resin (E)

In a 2 liter three-necked flask equipped with a stirrer, a thermometer and a condenser, 1000 g of bisphenol A, 214 g of 37% formalin and 2 g of p-toluenesulfonic acid as catalyst were placed and heated. When the temperature of the reaction mixture became 85° C., heating was stopped and there brought about reflux with boiling by the heat of reaction evolved. After violent reflux was subsided, the reaction mixture was heated again to continue the reaction for 1 hour. After the reaction, the reaction product in the flask was moved to an evaporating dish and a water layer was removed by decantation to give a novolac type bisphenol-formaldehyde resin. Although unreacted bisphenol A was retained in the resin, the resin was used for the next step reaction without purification.

In a 2 liter three-necked flask equipped with a stirrer, a thermometer and a condenser, 500 g of the thus produced resin, 500 g of epoxidized linseed oil, and 5 g of triethylamine were placed and heated. The reaction was carried out at 160° C. for 4 hours. It was ascertained by HLC that the peaks representing epoxidized linseed oil were almost varnished. To the reaction solution, 148 g of 80% paraformaldehyde and 24 g of 25% ammonia water were added and reacted at 80° C. for 4 hours. The resulting resin had a gel time of 234 seconds measured on a hot plate (160° C.).

The resin was dissolved in 300 g of acetone to give a varnish, i.e. Resin (E).

Cotton linter paper was impregnated with Resin (C), the water soluble phenol resin, and dried to produce resin impregnated paper having a resin content of 15%. The resulting resin impregnated paper was further impregnated with Resin (E) and dried to produce resin impregnated paper having a resin content of 48%.

Eight sheets of the resin impregnated paper and one sheet of copper foil having a binding agent on one side were piled up and compressed at 160°–170° C. under 140 kg/cm² for 50 minutes to give a copper-clad laminate of 1.6 mm thick.

Physical and chemical properties of the thus produced copper-clad laminate and those of Comparative Example 1 are as shown in Table 2.

Table 2

| Varnish | Example 3 Resin (E) | Comparative Example 1 Resin (D) |
|---|---|---|
| Insulation JIS-C6481 A resistance | $4.0 \times 10^{12}$ | $1.4 \times 10^{11}$ |
| (Ω) JIS-C6481 D-2/100 | $2.3 \times 10^{10}$ | $6.5 \times 10^{9}$ |
| Heat resistance in the air (at 200° C.) | Over 60 minutes No change | 30 minutes No change |
| Heat resistance in solder at 260° C. (sec) | 50.6 | 33.8 |
| Solvent resistance (in trichloroethylene) JIS-C6481 D | Over 60 minutes No change | 30 minutes No change |
| Punchability JIS-C6481 A | | |
| Surface | 80 | 70 |
| Edge face | 80 | 70 |
| Hole (points/100) | 80 | 70 |
| Water absorption (%) JIS-C6481 D-24/23 | 0.76 | 0.82 |

EXAMPLES 4 AND 5, COMPARATIVE EXAMPLE 2

Resin (H)

In a 3 liter three-necked flask equipped with a stirrer, a thermometer, and a condenser, 1000 g of phenol, 740 g of 37% formalin and 15 g of a 10% hydrochloric acid solution as catalyst were placed and reacted at 85° C. for about 2 hours. Subsequently the reaction product was moved to an evaporating dish and a water layer was removed by decantation. The resin portion in the evaporating dish was heated with stirring to remove water and unreacted phenol. When a resin temperature became 170°–175° C., heating was stopped and the resin was flowed on a metal tray and solidified to give a novolac type phenolformaldehyde resin. No unreacted phenol retained was identified by HLC. Hydroxyl equivalent was 105.

In a 2 liter flask, 200 g of the thus obtained resin, 500 g of epoxidized soya bean oil, 300 g of bisphenol A, and 30 g of dimethylbenzylamine were placed and reacted at 150° C. for 6 hours. Subsequently 500 g of phenol, 320 g of paraformaldehyde and 6.8 g of ethylenediamine were added and the reaction was carried out at 80° C. for 4 hours. The resulting resin had a gel time of 189 seconds measured on a hot plate (160° C.).

The resin was dissolved in acetone to give a varnish having a resin content of 52%, Resin (H).

Resin (J)

The procedure of obtaining Resin (H) was repeated except for using diethylamine in place of dimethylbenzylamine to give Resin (J).

Resin (I) (Comparison)

In a 3 liter flask, 800 g of m-cresol, 400 g of tung oil, and 1 g of p-toluenesulfonic acid were placed and the reaction was carried out at 120° C. for 2 hours. Subsequently the reaction solution was cooled to 70° C. and 333 g of 80% paraformaldehyde, and 28.8 g of 25% ammonia water were added thereto. The reaction was carried out at 80° C. for 3 hours while removing water under reduced pressure. The resulting resin had a gel time of 203 seconds measured on a hot plate (160° C.). The resin was dissolved in methyl ethyl ketone to give a varnish having a resin content of 52%.

Undercoating resin (A water soluble phenol resin)

Phenol (400 g), 800 g of a 37% formalin aqueous solution, and 5 g of magnesium hydroxide were reacted at 55° C. for 8 hours. After removing water under reduced pressure, methanol was added to the resulting resin to give a water soluble phenol resin having a resin content of 15%.

Cotton linter paper was impregnated with the thus obtained undercoating resin and dried to produce resin impregnated paper having a resin content of 15%. The resulting resin impregnated paper was further impregnated with Resin (H), (I) or (J) and dried to produce resin impregnated paper having a resin content of 48%.

Eight sheets of the resin impregnated paper and one sheet of copper foil having a binding agent on one side were piled up and compressed at 160°–170° C. under 140 kg/cm² for 50 minutes to give copper-clad laminates of 1.6 mm thick.

Physical and chemical properties of thus produced copper-clad laminates are as shown in Table 3.

Table 3

| | Example 4 | Example 5 | Comparative Example 2 |
|---|---|---|---|
| Varnish | Resin (H) | Resin (J) | Resin (I) |
| Insulation JIS-C6481 A resistance | $2.3 \times 10^{12}$ | $1.2 \times 10^{12}$ | $2.1 \times 10^{11}$ |
| ($\Omega$) JIS-C6481 D-2/100 | $5.9 \times 10^{10}$ | $4.9 \times 10^{10}$ | $3.8 \times 10^{9}$ |
| Heat resistance in the air (at 200° C.) | Over 60 minutes No change | Over 60 minutes No change | 30 minutes No change |
| Heat resistance in solder at 260° C. (sec) | 45.4 | 55.3 | 28.0 |
| Solvent resistance (in trichloroethylene) JIS-C6481 D | Over 60 minutes No change | Over 60 minutes No change | 30 minutes No change |
| Punchability JIS-C6481 A | | | |
| Surface | 80 | 80 | 75 |
| Edge face | 80 | 80 | 70 |
| Hole (points/100) | 85 | 85 | 75 |
| Water absorption (%) JIS-C6481 D-24/23 | 0.76 | 080 | 0.91 |

EXAMPLES 6 AND 7, COMPARATIVE EXAMPLE 3

Resin (K)

In a four-necked flask equipped with a condenser and a stirrer, 940 g of phenol and 3250 g of 37% formalin were placed and 8 g of a 50% sodium hydroxide solution was added thereto with stirring. The reaction was carried out at 75° C. until water miscibility degree became 0.5 ml/g (30° C.). Subsequently the reaction solution was cooled to room temperature and acetic acid was added thereto to adjust the pH to 5.0. A precipitated resin was separated and purified.

To 60 parts of the thus obtained resol type phenol-formaldehyde resin, 40 parts of epoxidized linseed oil and 5 parts of benzyldimethylamine were added and the reaction was carried out at 90° C. for 6 hours. The resulting resin had a gel time of 188 seconds measured on a hot plate (160° C.). The resin was dissolved in methyl ethyl ketone to give a varnish having a resin content of 52%, Resin (K).

Cotton linter paper undercoated with Resin (C), the water soluble phenol resin, was impregnated with Resin (K) and dried to give resin impregnated paper having a resin content of 45%.

Eight sheets of the resin impregnated paper were piled up and compressed at 160°-165° C. under 80 kg/cm$^2$ for 50 minutes to give a liminate of 1.6 mm thick.

Resin (L)

In a 3 liter four-necked flask equipped with a condenser and a stirrer, 1080 g of m-cresol and 2900 g of 37% formalin were placed and 8 g of a 50% sodium hydroxide solution was added thereto with stirring. The reaction was carried out at 60° C. for 12 hours. After cooling, the reaction solution was adjusted to pH 6.5 with hydrochloric acid. A precipitated resin was separated and purified.

To 50 parts of the thus obtained resol type phenol-formaldehyde resin, 50 parts of epoxidized soya bean oil and 5 parts of benzyldimethylamine were added and the reaction was carried out at 80° C. for 10 hours. The resulting resin had a gel time of 240 seconds measured on a hot plate (160° C.) The resin was dissolved in methyl ethyl ketone to give a varnish having a resin content of 52%, Resin (L).

Resin (C) in an amount of 20 parts in terms of a solid content was mixed with Resin (L) in an amount of 80 parts in terms of a solid content and the resulting mixture was dissolved in methyl ethyl ketone so as to contain a resin content of 52%. Cotton linter paper undercoated with Resin (C), i.e. the water soluble phenol resin, was impregnated with the thus obtained mixture of Resin (C) and Resin (L).

A laminate of 1.6 mm thick was produced in the same manner as described above in the formation of the laminate from Resin (K).

Resin (M) (Comparison)

Tung oil (873 g), 1142 g of m-cresol and 1 g of p-toluenesulfonic acid were reacted at 110° C. for 1 hour. Subsequently 41 g of p-tert-butylphenol, 60 g of paraformaldehyde, and 6 g of 25% ammonia water were added and the reaction was carried out at 80° C. for 3 hours. After removing water under reduced pressure, the resulting resin was dissolved in methyl ethyl ketone to give a varnish having a resin content of 52%, Resin (M).

A laminate of 1.6 mm thick was produced in the same manner as mentioned above in the formation of the laminate from Resin (K).

Physical and chemical properties of the laminates are as shown in Table 4.

As paper base materials which are to be impregnated with the above-mentioned resins of Examples and Comparative Example, not only cotton linter paper but also kraft paper and other paper base materials can be used.

Table 4

| Varnish | | | Example 6 Resin (K) | Example 7 Resin (L) | Comparative Example 3 Resin (M) |
|---|---|---|---|---|---|
| Insulation resistance ($\Omega$) | Normal state | JIS-C6481 A | $5.1 \times 10^{12}$ | $4.2 \times 10^{12}$ | $3.3 \times 10^{12}$ |
| | After boiling | JIS-C6481 D-2/100 | $1.3 \times 10^{11}$ | $4.7 \times 10^{11}$ | $6.1 \times 10^{10}$ |
| Heat resistance in the air (at 200° C.) | | | Over 60 minutes No change | Over 60 minutes No change | 30 minutes No change |
| Solvent resistance (in trichloroethylene at boiling) JIS-C6481 D | | | Over 60 minutes No change | Over 60 minutes No change | 30 minutes No change |
| Punchability JIS-C6481 A | | | | | |
| Surface | | | 70 | 70 | 60-70 |

Table 4-continued

| Varnish | Example 6 Resin (K) | Example 7 Resin (L) | Comparative Example 3 Resin (M) |
|---|---|---|---|
| Edge face | 80 | 70 | 70 |
| Hole (points/100) | 80 | 80 | 70 |
| Water absorption (%) JIS-C6481 D-24/23 | 0.66 | 0.68 | 0.88 |

As mentioned above, laminates obtained by using the resins produced by the process of this invention are particularly excellent in electrical properties such as insulation resistance, heat resistance such as in solder and heat stability due to the epoxidized vegetable oil used in this invention which is reactive and has no double bond comparing with conventional vegetable oils such as tung oil which is widely used and has double bonds. Further the laminates obtained by using the resins produced by the process of this invention are excellent in punchability comparing with the case using tung oil. This means that the epoxidized vegetable oil has excellent property as a plasticizer for phenolic resins.

What is claimed is:

1. A process for producing an internally plasticized phenolic resin which comprises reacting a phenol-formaldehyde resin containing less than 4% by weight of unreacted free monohydric phenol or phenols with an epoxidized vegetable oil, or with an epoxidized vegetable oil and formaldehyde, with heating.

2. A process according to claim 1, wherein the phenol-formaldehyde resin is a novolac resin.

3. A process according to claim 2, wherein the novolac resin is a novolac bisphenol-formaldehyde resin.

4. A process according to claim 1, wherein the phenol-formaldehyde resin is a novolac phenol-formaldehyde resin.

5. A process according to claim 4, wherein the novolac phenol-formaldehyde resin contains a bisphenol monomer.

6. A process according to claim 1, wherein the phenol-formaldehyde resin is a resol phenol-formaldehyde resin.

7. A process according to claim 1, wherein the phenol-formaldehyde resin is a mixture or polycondensation product of a novolac phenol-formaldehyde resin and a novolac bisphenol-formaldehyde resin.

8. A process according to claim 1, wherein the phenol-formaldehyde resin contains less than 1% by weight of unreacted free monohydric phenol or phenols.

9. A process according to claim 1, wherein the reaction is carried out in the presence of one or more secondary and/or tertiary amines.

10. A process according to claim 9, wherein said secondary and/or tertiary amines are selected from the group consisting of dimethylamine, diethylamine, dipropylamine, dibutylamine, diallylamine, diamylamine, trimethylamine, triethylamine, tripropylamine, tributylamine, triamylamine, triallylamine, dimethylaniline, diethylaniline, tribenzylamine, triphenylamine and benzyldimethylamine.

11. A process according to claim 1, or 2, wherein novolac phenol-formaldehyde resin or novolac bisphenol-formaldehyde resin or a mixture or polycondensation product of the two is reacted with the epoxidized vegetable oil first, and subsequently formaldehyde is added to reaction system to further proceed the reaction.

12. A process according to claim 11, wherein one or more phenols or bisphenols are added to the reaction system together with formaldehyde.

13. A process according to claim 11, wherein 0.5 to 4 equivalents of formaldehyde is used per one equivalent of the phenol-formaldehyde resin.

14. A process according to claim 13, wherein the formaldehyde is reacted with the reaction product of the novolac phenol-formaldehyde resin or the novolac bisphenol-formaldehyde resin or a mixture or polycondensation product of the two and the epoxidized vegetable oil at a temperature of 50°-100° C.

15. A process according to claim 1, wherein the epoxidized vegetable oil is reacted with the phenol-formaldehyde resin in a ratio of 1:1 to 1:8 in terms of the molar ratio of the epoxy group to the phenolic hydroxyl group.

16. A process according to claim 1, wherein the epoxidized vegetable oil is an internally epoxidized vegetable oil having an oxirane oxygen content of 2 to 8% by weight.

17. A process according to claim 1, wherein a novolac phenol-formaldehyde resin is reacted with an epoxidized vegetable oil and formaldehyde with heating.

18. A process according to claim 1, wherein a resol phenol-formaldehyde resin is reacted with an epoxidized vegetable oil.

19. A process according to claim 1, wherein a novolac bisphenol-formaldehyde resin in which the bisphenol is represented by the formula:

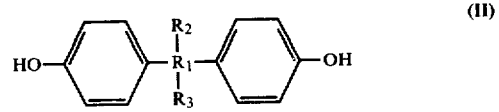
(II)

wherein $R_1$ is $C_1$ to $C_3$ alkylene residue; and $R_2$ and $R_3$ are independently hydrogen or $C_1$ to $C_3$ saturated or unsaturated hydrocarbon groups, or a mixture of the novolac bisphenol-formaldehyde resin and the bisphenol of the formula (II) is reacted with an epoxidized vegetable oil and formaldehyde with heating.

20. A process according to claim 1, wherein one or more members selected from the group consisting of a novolac phenol-formaldehyde resin represented by the formula:

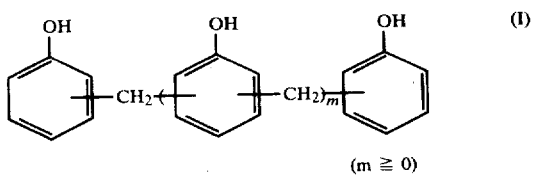
(I)

(m ≧ 0)

and a novolac bisphenol-formaldehyde resin in which the bisphenol is represented by the formula:

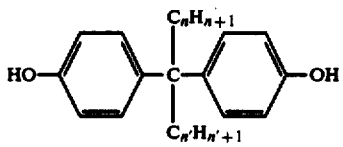 (III)

wherein n and n' are independently zero or an integer of 1 to 4, is reacted with an epoxidized vegetable oil with heating, and after that one or more phenols and formaldehyde are added to carry out resol formation reaction.

21. A process according to claim 20, wherein the phenol is phenol or m-cresol.

22. An internally plasticized phenolic resin produced by the process of one of claims 1 to 9 and 15 to 21.

23. A process according to claim 1, wherein said heating is performed to provide a temperature for said reacting of between 80°–160° C.

24. A process according to claim 1, wherein said epoxidized vegetable oil is selected from the group consisting of epoxidized linseed oil, epoxidized soya bean oil, epoxidized castor oil and epoxidized dehydrated castor oil.

* * * * *